(12) United States Patent
Mishima et al.

(10) Patent No.: US 10,797,181 B2
(45) Date of Patent: Oct. 6, 2020

(54) SEMICONDUCTOR DEVICE AND METHOD FOR MANUFACTURING THE SAME

(71) Applicants: HOSEI UNIVERSITY, Tokyo (JP); SCIOCS COMPANY LIMITED, Ibaraki (JP); SUMITOMO CHEMICAL COMPANY, LIMITED, Tokyo (JP)

(72) Inventors: Tomoyoshi Mishima, Tokyo (JP); Fumimasa Horikiri, Ibaraki (JP)

(73) Assignees: HOSEI UNIVERSITY, Tokyo (JP); SCIOCS COMPANY LIMITED, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/327,969

(22) PCT Filed: Jun. 27, 2017

(86) PCT No.: PCT/JP2017/023554
§ 371 (c)(1),
(2) Date: Feb. 25, 2019

(87) PCT Pub. No.: WO2018/037705
PCT Pub. Date: Mar. 1, 2018

(65) Prior Publication Data
US 2019/0189808 A1    Jun. 20, 2019

(30) Foreign Application Priority Data

Aug. 26, 2016  (JP) .................................. 2016-166155

(51) Int. Cl.
*H01L 29/872*  (2006.01)
*C23C 16/34*  (2006.01)
(Continued)

(52) U.S. Cl.
CPC ............ *H01L 29/872* (2013.01); *C23C 16/34* (2013.01); *H01L 21/20* (2013.01); *H01L 21/205* (2013.01);
(Continued)

(58) Field of Classification Search
CPC ............. H01L 29/2003; H01L 29/8613; H01L 21/0254; H01L 29/402
(Continued)

(56) References Cited

U.S. PATENT DOCUMENTS 4,982,260 A * 1/1991 Chang ................... H01L 29/861
257/476
2007/0096239 A1   5/2007 Cao et al.
(Continued)

FOREIGN PATENT DOCUMENTS

JP    2002-319685 A   10/2002
JP    2009081269 A    4/2009
(Continued)

OTHER PUBLICATIONS

English Translation of the International Preliminary Report on Patentability and Written Opinion for PCT/JP2017/023554 (dated Mar. 7, 2019).
(Continued)

*Primary Examiner* — Jonathan Han
(74) *Attorney, Agent, or Firm* — Pearne & Gordon LLP

(57) ABSTRACT

A semiconductor device is included a first semiconductor layer with n-type conductivity, containing a gallium nitride-based semiconductor, a second semiconductor layer with p-type conductivity, which is laminated directly on the first semiconductor layer and contains a gallium nitride-based semiconductor added with a p-type impurity at a concentration of $1 \times 10^{20}$ cm$^{-3}$ or more, a first electrode disposed in contact with the first semiconductor layer, and a second
(Continued)

electrode disposed in contact with the second semiconductor layer, and the semiconductor device functions as a pn-junction diode.

15 Claims, 8 Drawing Sheets

(51) Int. Cl.
| | |
|---|---|
| *H01L 21/205* | (2006.01) |
| *H01L 29/868* | (2006.01) |
| *H01L 33/32* | (2010.01) |
| *H01L 29/06* | (2006.01) |
| *H01L 21/20* | (2006.01) |
| *H01L 29/861* | (2006.01) |
| *H01L 29/47* | (2006.01) |
| *H01L 29/20* | (2006.01) |
| *H01L 29/66* | (2006.01) |

(52) U.S. Cl.
CPC .......... *H01L 29/06* (2013.01); *H01L 29/2003* (2013.01); *H01L 29/47* (2013.01); *H01L 29/66136* (2013.01); *H01L 29/66143* (2013.01); *H01L 29/861* (2013.01); *H01L 29/868* (2013.01); *H01L 29/8613* (2013.01); *H01L 33/32* (2013.01)

(58) Field of Classification Search
USPC .................. 257/E29.326, E29.327, E29.338
See application file for complete search history.

(56) References Cited

U.S. PATENT DOCUMENTS

| | | | |
|---|---|---|---|
| 2009/0236589 A1* | 9/2009 | Ohno | B82Y 20/00 257/40 |
| 2013/0126888 A1 | 5/2013 | Kizilyalli et al. | |
| 2013/0161780 A1 | 6/2013 | Kizilyalli et al. | |
| 2013/0328120 A1* | 12/2013 | Ueno | H01L 29/7827 257/329 |
| 2014/0021883 A1 | 1/2014 | Katona et al. | |
| 2015/0069443 A1* | 3/2015 | Reboud | H01L 33/12 257/98 |
| 2015/0243736 A1 | 8/2015 | Kaneda | |

FOREIGN PATENT DOCUMENTS

| | | | |
|---|---|---|---|
| JP | 2010-040698 A | | 2/2010 |
| JP | 2010040698 A | * | 2/2010 |
| JP | 2013-149914 A | | 8/2013 |
| JP | 2014-013886 A | | 1/2014 |
| JP | 2015-149391 A | | 8/2015 |
| JP | 2016-025264 A | | 2/2016 |
| JP | 2016-143780 A | | 8/2016 |

OTHER PUBLICATIONS

International Search Report for PCT/JP2017/023554 (dated Aug. 15, 2017).
Written Opinion for PCT/JP2017/023554 (dated Aug. 15, 2017).
Search Report issued in European Patent Application No. 17843193.8 dated Feb. 27, 2020.

* cited by examiner

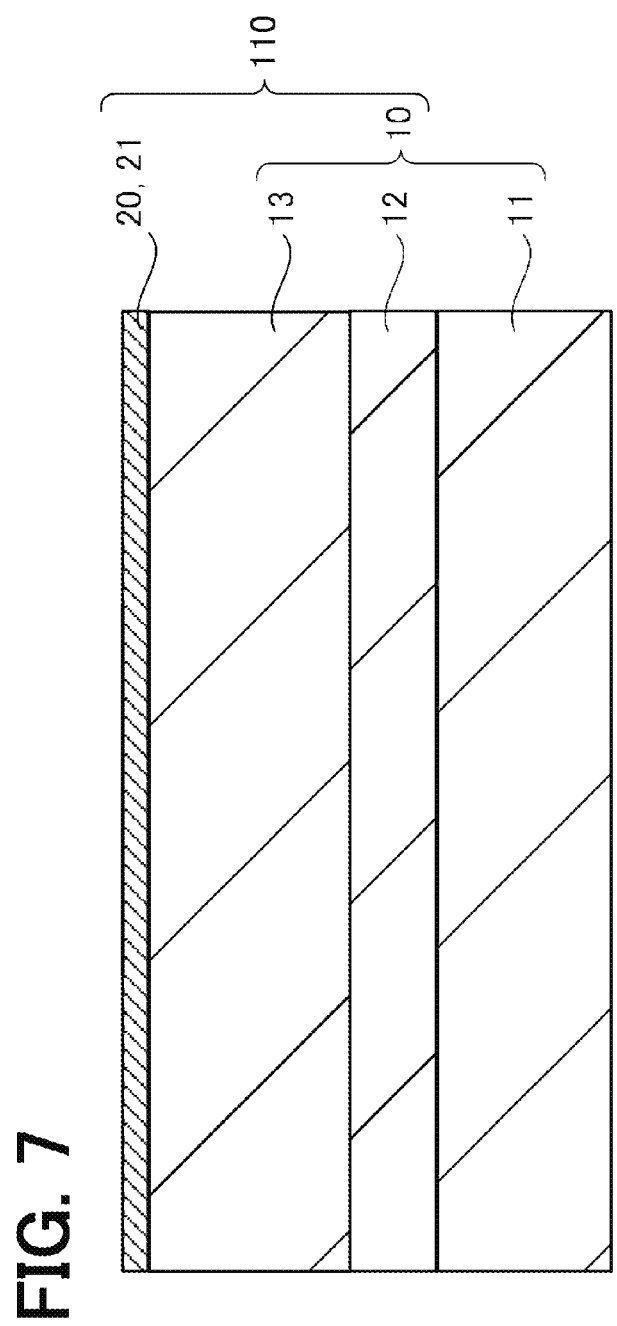

US 10,797,181 B2

SEMICONDUCTOR DEVICE AND METHOD FOR MANUFACTURING THE SAME

TECHNICAL FIELD

The present disclosure relates to a semiconductor device and a method for manufacturing the same.

DESCRIPTION OF RELATED ART

Attention has been payed to gallium nitride (GaN)-based semiconductors, as a high-frequency electronic element material with a high breakdown voltage and a high output, and a light emitting element material capable of emitting light from red to ultraviolet.

When pn-junction that functions as a diode is formed using the GaN-based semiconductor, for example, a p-type semiconductor layer is configured by a laminated structure of a p-type GaN-based semiconductor layer whose p-type impurity concentration is about $10^{18}$ cm$^{-3}$ and whose thickness is about several hundred nanometers (nm), and a p-type GaN-based semiconductor layer whose p-type impurity concentration is about $10^{20}$ cm$^{-3}$ and whose thickness is about several ten nm (see patent document 1, for example).

PRIOR ART DOCUMENT

Patent Document

[Patent Document 1] Japanese Patent Laid Open Publication No. 2015-149391

SUMMARY OF THE INVENTION

Problem to be Solved by the Invention

Simplifying a configuration of the p-type semiconductor layer is preferable from a viewpoint of simplifying a manufacturing process of the p-type semiconductor layer, and the like.

An object of the present disclosure is to provide a semiconductor device capable of functioning as a pn-junction diode using the GaN-based semiconductor and capable of simplifying a configuration of the p-type semiconductor layer, a method for manufacturing the same, and a semiconductor laminate that can be used therefore.

Means for Solving the Problem

According to an aspect of the present disclosure, there is provided a semiconductor device that functions as a pn-junction diode, including:

a first semiconductor layer with n-type conductivity, containing a gallium nitride-based semiconductor;

a second semiconductor layer with p-type conductivity, which is laminated directly on the first semiconductor layer, and contains a gallium nitride-based semiconductor added with a p-type impurity at a concentration of $1 \times 10^{20}$ cm$^{-3}$ or more;

a first electrode disposed in contact with the first semiconductor layer; and a second electrode disposed in contact with the second semiconductor layer.

According to another aspect of the present disclosure, there is provided a method for manufacturing a semiconductor device that functions as a pn-junction diode, including:

preparing a semiconductor laminate including a first semiconductor layer with n-type conductivity, which contains a gallium nitride-based semiconductor, and a second semiconductor layer with p-type conductivity; which is laminated directly on the first semiconductor layer and contains a gallium nitride-based semiconductor added with a p-type impurity at a concentration of $1 \times 10^{20}$ cm$^{-3}$ or more;

forming a first electrode disposed in contact with the first semiconductor layer; and forming a second electrode disposed in contact with the second semiconductor layer.

According to further another aspect of the present disclosure, there is provided a semiconductor laminate capable of functioning as a pn-junction diode, including:

a first semiconductor layer with n-type conductivity, comprising (containing) a gallium nitride-based semiconductor; and a second semiconductor layer with p-type conductivity, which is laminated directly on the first semiconductor layer, and contains a gallium nitride-based semiconductor added with a p-type impurity at a concentration of $1 \times 10^{20}$ cm$^{-3}$ or more.

Advantage of the Invention

A diode using the gallium nitride-based semiconductor can be formed by pn-junction using the p-type semiconductor layer (the second semiconductor layer) whose p-type impurity concentration is $1 \times 10^{20}$ cm$^{-3}$ or more. Therefore, a p-type gallium nitride-based semiconductor layer whose p-type impurity concentration is less than $1 \times 10^{20}$ cm$^{-3}$ (for example, about $10^{18}$ cm$^{-3}$), is unnecessary. Thereby, the configuration of the p-type semiconductor layer can be simplified, and the manufacturing process of the p-type semiconductor layer can be simplified. Further, the p-type semiconductor layer can be thinned, a resistance due to the p-type semiconductor layer during a forward operation can be reduced, and energy consumption can be reduced.

BRIEF DESCRIPTION OF THE DRAWINGS

FIG. 7 is a schematic cross-sectional view showing an example of a semiconductor laminate.

DETAILED DESCRIPTION OF THE INVENTION

Figure 1:
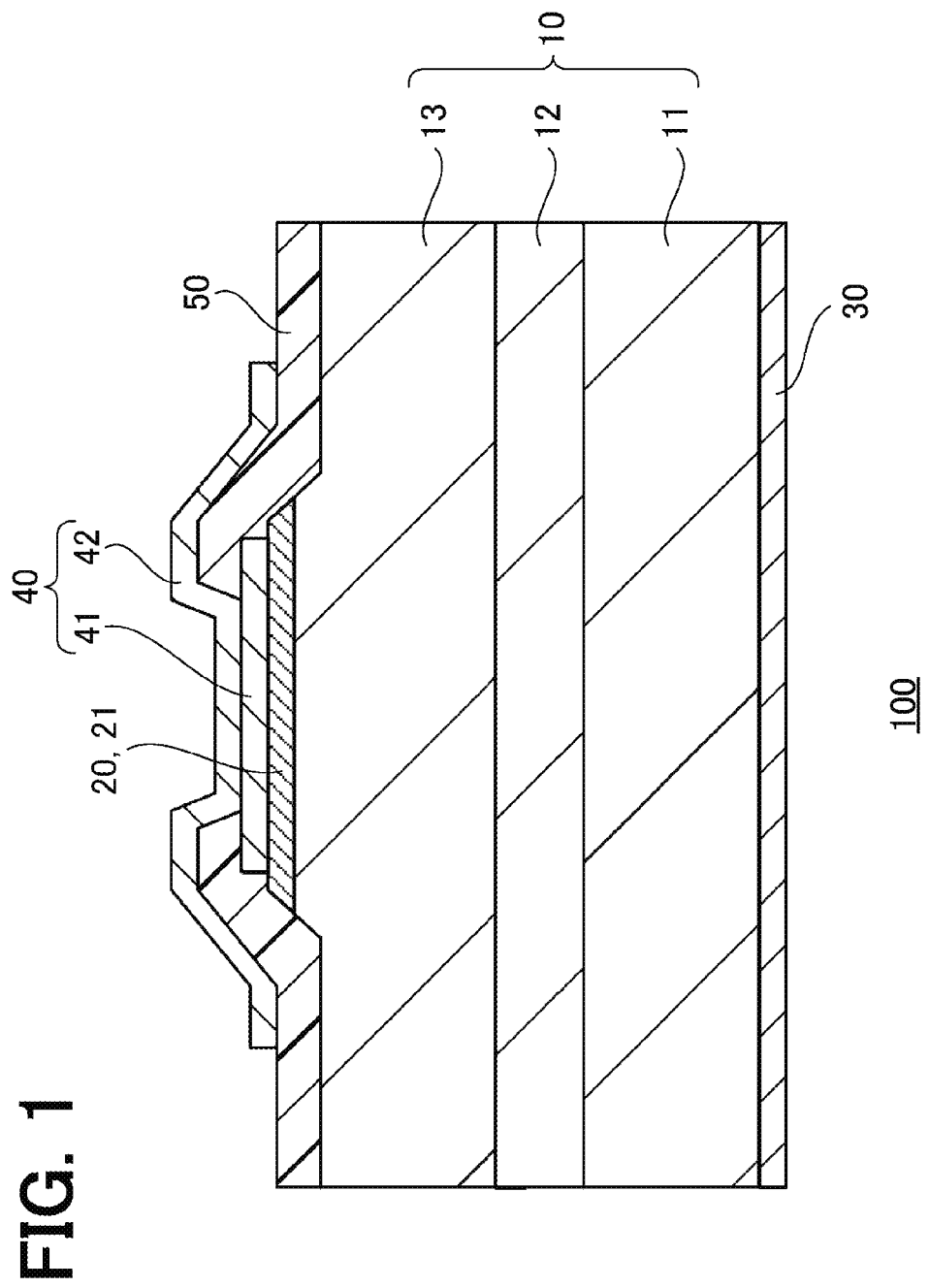
FIG. 1 is a schematic cross-sectional view of a semiconductor device according to a first embodiment of the present disclosure.

A semiconductor device 100 according to a first embodiment of the present disclosure will be exemplarily described, with reference to FIG. 1. FIG. 1 is a schematic cross-sectional view of the semiconductor device 100 according to the first embodiment.

The semiconductor device 100 includes a semiconductor layer 10 with n-type conductivity, a semiconductor layer 20 with p-type conductivity, an electrode 30, and an electrode 40, and functions as a pn-junction diode. The semiconductor layer 10 contains a gallium nitride (GaN)-based semiconductor. The semiconductor layer 20 is laminated directly on the n-type semiconductor layer 10, and contains a GaN-based semiconductor added with a p-type impurity at a concentration of $1 \times 10^{20}$ cm$^{-3}$ or more. The electrode 30 is disposed in contact with the semiconductor layer 10. The electrode 40 is disposed in contact with the semiconductor layer 20. The semiconductor layer 10 is also referred to as an n-type semiconductor layer 10, the semiconductor layer 20 is also referred to as a p-type semiconductor layer 20, the electrode 30 is also referred to as an n-side electrode 30, and the electrode 40 is also referred to as a p-side electrode 40.

In an embodiment described hereafter, for example, GaN is used as the GaN-based semiconductor, namely, semiconductor including gallium (Ga) and nitrogen (N). However, the GaN-based semiconductor is not limited to GaN. A semiconductor including a group-III element other than Ga is addition to Ga and N as required can be used as the GaN-based semiconductor.

For example, aluminum (Al) and indium (In) are used as the group-III element other than Ga. However, from a viewpoint of reducing a lattice strain, the group-III element other than Ga is preferably contained so that a lattice mismatch with GaN of the GaN-based semiconductor containing the group-III element, other than Ga is 1% or less. For example, a content of Al in AlGaN allowed in the GaN-based semiconductor is 40 atomic % or less in the group-III element. Further, for example, a content of In in InGaN allowed in the GaN-based semiconductor is 10 atomic % or less in the group-III element. It is also acceptable to use InAlGaN in combination of GaN and InAlN having In content in InAlN is 10 atomic % or more and 30 atomic % or less in the group-III element, at arbitrary composition. When Al and In compositions are within the above range, the lattice strain from GaN is hardly increased, and therefore cracks hardly occur.

For example, the n-type semiconductor layer 10 has a laminated structure in which an n-type GaN substrate 11, an n-type GaN layer 12, and an n-type GaN layer 13 are laminated. The n-type GaN substrate 11 is a substrate added with silicon (Si) as an n-type impurity at a concentration of $2 \times 10^{18}$ cm$^{-3}$ for example, and having a thickness of 400 μm for example. The n-type GaN layer 12 is a layer (n layer) added with Si at a concentration of $2 \times 10^{18}$ cm$^{-3}$ for example, and having a thickness of 2 μm for example. The n-type GaN layer 13 is a layer (n layer) added with Si at a concentration of $1.2 \times 10^{16}$ cm$^{-3}$ for example, and having a thickness of 13 μm for example.

A structure of the n-type semiconductor layer 10 is not particularly limited. For example, the n-type semiconductor layer 10 may be configured including an undoped n-type GaN layer with the n-type conductivity although the n-type impurity is not added.

The p-type semiconductor layer 20 is laminated directly on the n-type semiconductor layer 10, namely, directly on the n-type GaN layer (n layer) 13. The p-type semiconductor layer 20 is configured by a p-type GaN layer 21. The p-type GaN layer 21 is a layer (p$^{++}$ layer) added with magnesium (Mg) as the p-type impurity at a concentration of $2 \times 10^{20}$ cm$^{-3}$ for example, and having a thickness of 30 μm for example.

Pn-junction is formed by the p-type semiconductor layer 20 and the n-type semiconductor layer 10, namely, by the p-type GaN layer 21 and the n-type GaN layer 13. Since the p-type semiconductor layer 20 is laminated on the n-type semiconductor layer 10, an upper surface of the p-type semiconductor layer 20 is disposed at a higher position (at a position farther away from the substrate 11) than an upper surface of the n-type semiconductor layer 10 (a height of the upper surface of the p-type semiconductor layer 20 differs from a height of the upper surface of the n-type semiconductor layer 10). Further a pn-junction interface is flat.

The n-side electrode 30 is provided on a lower surface of the n-type GaN substrate 11. Namely, the n-side electrode 30 is disposed in contact with the n-type semiconductor layer 10 on the lower surface of the n-type semiconductor layer 10. For example, the n-side electrode 30 is formed of a laminated film in which a titanium (Ti) layer with a thickness of 50 μm and an aluminum (Al) layer with a thickness of 250 nm are laminated in this order from an n-type semiconductor layer 10 side.

The p-side electrode 40 is provided on an upper surface of the p-type GaN layer 21. Namely, the p-side electrode 40 is disposed in contact with the p-type semiconductor layer 20 on the upper surface of the p-type semiconductor layer 20. In the semiconductor device 100 according to the first embodiment, the p-side electrode 40 is disposed in contact with the p-type semiconductor layer 20 and not in contact with the n-type semiconductor layer 10.

For example, the p-side electrode 40 has a laminated structure in which a p-side bottom electrode 41 and a p-side top electrode 42 are laminated. The p-side bottom electrode 41 is provided on the upper surface of the p-type semiconductor layer 20 so as to be included in the p-type semiconductor layer 20 in a planar view. For example, the p-side bottom electrode 41 has a circular shape in planar view. For example, the p-side bottom electrode 41 is formed of a laminated film in which a palladium (Pd) layer with a thickness of 200 nm and a nickel (Ni) layer with a thickness of 100 nm are laminated in this order from a p-type semiconductor layer 20 side. The p-side top electrode 42 will be described in detail later.

The semiconductor device 100 shown in the example has a mesa structure, and has an insulating protective film 50 provided so as to cover the upper surface of the n-type semiconductor layer 10 disposed at an outside of the mesa structure, a lateral surface of the mesa structure, and an edge portion of the upper surface of the p-type semiconductor layer 20 constituting an upper surface of the mesa structure. For example, the protective film 50 is formed of a laminated film of a silicon oxide (Si(O$_2$) film by a spin-on-glass and a SiO$_2$-film by a sputtering method. A thickness of the protective film 50 is about 600 nm for example.

The protective film 50 has an opening on the upper surface of the p-type semiconductor layer 20. An opening edge portion of the protective film 50 is provided so as to ride on an edge portion of the p-side bottom electrode 41, and an upper surface of the p-side bottom electrode 41 is exposed in the opening of the protective film 50.

The p-side top electrode 42 is provided on the upper surface of the p-side bottom electrode 41 exposed in the opening of the protective film 50, and extends on the protective film 50 so as to reach the upper surface of the n-type semiconductor layer 10 at the outside of the mesa structure in a planar view. The p-side top electrode 42 functions as a field plate electrode portion for improving a breakdown voltage (reverse breakdown voltage) when applying a reverse voltage. For example, the p-side top electrode 42 is formed of a laminated film in which a Ti-layer with a thickness of 30 nm and an Al-layer with a thickness of 250 nm are laminated in this order from the p-type semiconductor layer 20 side.

A structure of the p-side electrode 40 is not particularly. For example, the p-side electrode 40 may be not the laminated structure of the p-side bottom electrode 41 and the p-side top electrode 42 but a single layer structure. Further, for example, the p-side electrode 40 may not have the field plate electrode portion. However, it is preferable to have the field plate electrode portion, from a viewpoint of improving the reverse breakdown voltage.

The semiconductor device 100 according to the embodiment has a characteristic that the p-type semiconductor layer 20 is configured by a p-type GaN-based semiconductor layer added with the p-type impurity at a concentration of $1 \times 10^{20}$ cm$^{-3}$ or more. Such a characteristic will be described hereafter while contrasting with a semiconductor device according to a comparative embodiment.

Figure 8:
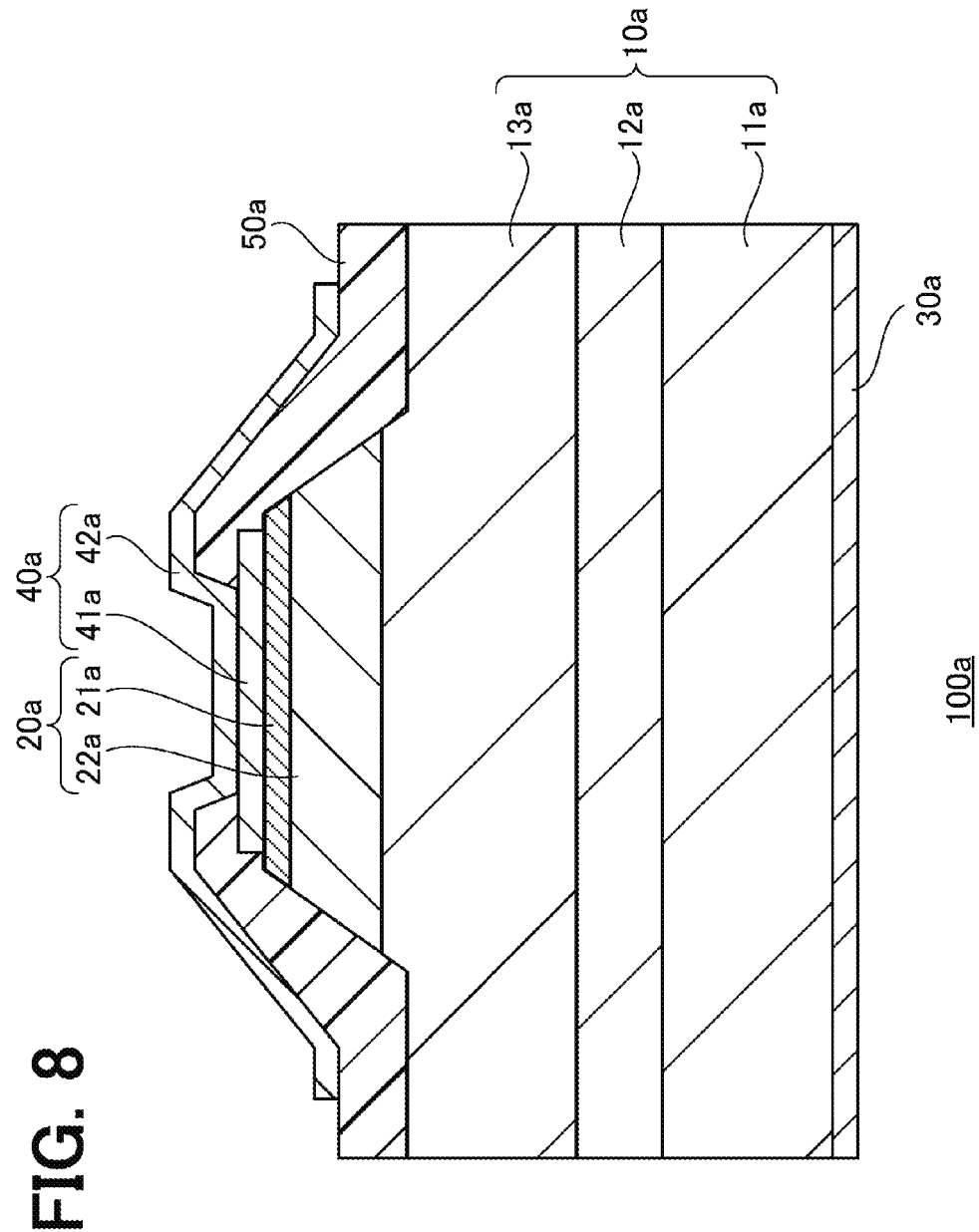
FIG. 8 is a schematic cross-sectional view of a semiconductor device according to a comparative embodiment.

FIG. 8 is a schematic cross-sectional view of a semiconductor device 100a according to the comparative embodiment. Members and structures of the comparative embodiment corresponding to the first embodiment will be described, with using reference numbers adding "a" to the reference numbers of the first embodiment.

The semiconductor device 100a according to the comparative embodiment differs from the semiconductor device 100 according to the first embodiment, in a point that a p-type semiconductor layer 20a has a laminated structure in which a p-type GaN layer 22a and a p-type GaN layer 21a are laminated. The p-type GaN layer 22a is a layer (p layer) added with Mg at a concentration of $1 \times 10^{18}$ cm$^{-3}$ for example, and has a thickness of 400 nm for example. The p-type GaN layer 21a is a layer (p$^{++}$ layer) added with Mg at a concentration of $2 \times 10^{20}$ cm$^{-3}$ for example, and has a thickness of 30 nm for example.

When pn-junction that functions as a diode is formed using the GaN-based semiconductor, according to a common general technical knowledge, a p-type GaN-based semiconductor layer is used, whose p-type impurity concentration is suppressed to $10^{19}$ cm$^{-3}$ order at most, namely, less than $1 \times 10^{20}$ cm$^{-3}$, from a viewpoint of suppressing a deterioration of a crystal quality. It is conceivable that the p-type GaN-based semiconductor layer whose p-type impurity concentration is $10^{20}$ cm$^3$ or more order, namely, $1 \times 10^{20}$ cm$^{-3}$ or more, cannot be utilized for forming pn-junction that functions as the diode, because it has a poor crystal quality due to a high impurity concentration.

Further, according to a common general technical knowledge, the p-type GaN based semiconductor layer with a thickness of about several hundred nm is used, from a viewpoint of improving the reverse breakdown voltage. It is conceivable that the p-type GaN-based semiconductor layer with a thickness of less than 100 nm cannot be utilized for forming pn-junction that function as the diode because it is too thin and cannot ensure the reverse breakdown voltage.

Therefore, in the comparative embodiment, the p-type GaN layer (p layer) 22a is laminated directly on an n-type semiconductor layer 10a, the p-type GaN layer 22a being added with Mg at a concentration of $1 \times 10^{18}$ cm$^3$ and having a thickness of 400 nm. Namely, pn-junction is formed by the p-type GaN layer (p layer) 22a whose p-type impurity concentration is suppressed to less than $1 \times 10^{20}$ cm$^{-3}$ and the n-type semiconductor layer 10a.

A p-side electrode 40a is provided on an upper surface of the p-type GaN layer (p$^{++}$ layer) 21a added with Mg at a concentration of $2 \times 10^{20}$ cm$^{-3}$ and having a thickness of 30 nm, namely, the p-type GaN layer (p$^{++}$ layer) 21a whose p-type impurity concentration is $1 \times 10^{20}$ cm$^{-3}$ or more. The p-type GaN layer (p$^{++}$ layer) 21a is laminated on the p-type GaN layer (p layer) 22a, for the purpose of forming an excellent ohmic contact with the p-side electrode 40a.

As described above, in the comparative embodiment, the p-type GaN layer (p$^{++}$ layer) 21a is provided for the purpose of forming the excellent ohmic contact with the p-side electrode 40a, and is not provided for the purpose of forming pn-junction.

However, as shown in an experimental result described later, the present inventors found that pn-junction using a p-type GaN-based semiconductor layer added with the p-type impurity at a concentration of $1 \times 10^{20}$ cm$^{-3}$ or more, functions excellently as the diode, contrary to a common general technical knowledge. This disclosure is based on such a finding.

The semiconductor device 100 according to the embodiment will be further described hereafter.

A concentration of the p-type impurity added into the p-type GaN layer 21, namely, the p-type semiconductor layer 20, is preferably $1 \times 10^{20}$ cm$^{-3}$ or more, more preferably $2 \times 10^{20}$ cm$^{-3}$ or more.

Since the p-type impurity concentration of the p-type GaN layer 21 is $1 \times 10^{20}$ cm$^{-3}$ or more, the p-side electrode 40 can be excellently in ohmic contact with the p-type GaN layer 21. Namely, pn-junction that functions excellently as the diode can be formed, and the excellent ohmic contact with the p-side electrode 40 can be obtained, using the p-type semiconductor layer 20 configured by the p-type GaN layer 21.

Therefore, the p-type semiconductor layer 20 can be configured without using the thick p-type GaN layer (p layer) 22a with a thickness of about several hundred nm required for the comparative embodiment.

Thereby, a configuration of the p-type semiconductor layer 20 can be simplified, and a manufacturing process of the p-type semiconductor layer 20 can be simplified. Further, the p-type semiconductor layer 20 can be thinned, a resistance due to the p-type semiconductor layer 20 during a forward operation can be reduced, and energy consumption can be reduced.

Further, as described later in detail, since the p-type impurity concentration is $1 \times 10^{20}$ cm$^{-3}$ or more, a high reverse breakdown voltage of several hundred volt (V) to 1000 V or more can be obtained even when the thin p-type GaN layer 21 with a thickness of less than 100 nm is used.

The p-type impurity concentration of the p-type GaN layer 21 may be more than $1 \times 10^{20}$ cm$^{-3}$.

From a viewpoint of more thinning the thickness of the p-type GaN layer 21 capable of obtaining the high reverse breakdown voltage, the p-type impurity concentration of the p-type GaN layer 21 is more preferably $2 \times 10^{20}$ cm$^{-3}$ or more.

The concentration of the p-type impurity added into the p-type GaN layer 21, namely, the p-type semiconductor layer 20 is preferably less than $1 \times 10^{21}$ cm$^{-3}$, more preferably $6 \times 10^{20}$ cm$^{-3}$ or less, and further more preferably $3 \times 10^{20}$ cm$^{-3}$ or less.

Since the p-type impurity concentration increases, a surface flatness of the p-type GaN layer deteriorates. When the surface flatness of the p-type GaN layer deteriorates excessively, the p-type GaN layer cannot be formed into a film shape covering an entire surface of a base. The present inventors performed an experiment in which the p-type GaN layer with the Mg-concentration of $6\times10^{20}$ cm$^{-3}$ and the thickness of 30 nm was grown. As a result, irregularities with a deepness of about 30 nm ran was observed on a crystal surface. Further, the present inventors performed an experiment in which the p-type GaN layer with the Mg-concentration of $3\times10^{20}$ cm$^{-3}$ and the thickness of 30 nm was grown. As a result, an abnormal growth did not occur, and the surface flatness was improved as compared to a case that Mg-concentration is $6\times10^{20}$ cm$^{-3}$. Even when Mg-concentration is the same as that of the above experiments, the surface flatness is expected to improve to some extent by optimizing a growth condition.

Therefore, it is conceivable that when the p-type impurity concentration of the p-type GaN layer 21 is $10^{20}$ cm$^{-3}$ order, namely, when the p-type impurity concentration is less than $1\times10^{21}$ cm$^{-3}$, the p-type GaN layer 21 can be formed into a film shape covering the entire surface of the base. The p-type impurity concentration of the p-type GaN layer 21 is more preferably $6\times10^{20}$ cm$^{-3}$ or less from a viewpoint of improving the surface flatness, and further more preferably $3\times10^{20}$ cm$^{-3}$ or less from a viewpoint of more improving the surface flatness and facilitating a film formation.

A thickness of the p-type GaN layer 21, namely, the p-type semiconductor layer 20 is preferably less than 100 nm, and more preferably 30 nm or less.

When the p-type impurity concentration is $1\times10^{20}$ cm$^{-3}$ or more, it is difficult to grow the p-type GaN layer 21 to a thickness of about several hundred nm. Further, as the p-type GaN layer 21 is thicker, a resistance due to the p-type GaN layer 21 increases, and a time required for growing the p-type GaN layer 21 increases. Therefore, the thickness of the p-type GaN layer 21 is preferably less than 100 nm, and more preferably 30 nm or less.

It is preferable that the p-type GaN layer 21 has the thin thickness of less than 100 nm, also from a viewpoint of facilitating a patterning which is performed for removing an entire surface, of an unnecessary portion of the p-type GaN layer 21 when forming the mesa structure or JBS-diode described later, etc., for example.

The thickness of the p-type GaN layer 21, namely, the p-type semiconductor layer 20 is preferably 2 nm or more, and more preferably 10 nm or more.

When the reverse voltage is applied, a depletion layer extends from the pn-junction interface toward both the n-type semiconductor layer 10 side and the p-type semiconductor layer 20 side, namely, toward both an n-type GaN layer 13 side and a p-type GaN layer 21 side. A ratio between a thickness of the depletion layer extending toward the n-type GaN layer 13 side and a thickness of the depletion layer extending toward the p-type GaN layer 21 side, is inversely proportional to a ratio between a donor concentration in the n-type GaN layer 13 and an acceptor concentration in the p-type GaN layer 21. Therefore, as the acceptor concentration in the p-type GaN layer 21 is higher, namely, as the p-type impurity concentration is higher, the thickness of the depletion layer extending toward the p-type GaN layer 21 side becomes thin.

Since the p-type GaN layer 21 is configured to have a thickness that the depletion layer does not reach the p-side electrode 40 when applying the reverse voltage, it is possible to ensure the reverse breakdown voltage of the p-type GaN layer 21.

The present inventors estimated the acceptor concentration when the Mg-concentration of the p-type GaN layer was $2\times10^{20}$ cm$^{-3}$, based on a reverse breakdown voltage of manufactured pn-junction diode. As a result, it was found that the acceptor concentration of about $5\times10^{19}$ cm$^{-3}$ can be expected.

The present inventors estimated the thickness of the depletion layer extending toward the p-type GaN layer side, when the acceptor concentration of the p-type GaN layer was $5\times10^{19}$ cm$^{-3}$, the donor concentration of the n-type GaN layer was $1\times10^{16}$ cm$^{-3}$, and the reverse applied voltage was 1000 V. As a result, it was found that the thickness of the depletion layer extending toward the p-type GaN layer side was about 2 nm.

In this example, since the acceptor concentration is 5000 times higher than the donor concentration, a ratio of the thickness of the depletion layer extending toward the p-type GaN layer side to the thickness of the depletion layer extending toward the n-type GaN layer side is 1/5000.

When the Mg-concentration of the p-type GaN layer is $1\times10^{20}$ cm$^{-3}$ and the reverse applied voltage is 1000 V, the thickness of the depletion layer on the p-type GaN layer side is estimated to be about 4 nm. Further, when the Mg-concentration of the p-type GaN layer is $1\times10^{20}$ cm$^{-3}$ and the reverse voltage is 500 V, the thickness of the depletion layer on the p-type GaN layer side is estimated to be about 2 nm.

From above consideration, the thickness of the p-type GaN layer 21 is preferably 2 nm or more from a viewpoint of obtaining the high reverse breakdown voltage of about 500 V or more for example, and more preferably 10 nm or more from a viewpoint of more improving the reverse breakdown voltage.

As described above, since the p-type impurity concentration of the p-type GaN layer 21 is $1\times10^{20}$ cm$^3$ or more, the high reverse breakdown voltage of several hundred V to 1000 V or more can be obtained even when using the thin p-type GaN layer 21 with the thickness of about several nm to several ten nm (namely, the thickness of less than 100 nm). For example, as shown in experimental results described later, it is confirmed that the reverse breakdown voltage of at least 400 V or more can be obtained.

A ratio of the concentration of the p-type impurity to the concentration of the n-type impurity is preferably 10000 times or more, the p-type impurity being added into the p-type semiconductor layer 20, and the n-type impurity being added into a portion of the n-type semiconductor layer 10 where pn-junction with the p-type semiconductor layer 20 is formed. Namely, in the semiconductor device 100 shown in the example, a ratio of the p-type impurity concentration to the n-type impurity concentration is preferably 10000 times or more, the p-type impurity being added into the p-type GaN layer 21, and the n-type impurity being added into the n-type GaN layer 13.

As described above, the ratio between the thickness of the depletion layer extending toward the n-type GaN layer 13 side and the thickness of the depletion layer extending toward the p-type GaN layer 21 side, is inversely proportional to the ratio between the donor concentration in the n-type GaN layer 13 and the acceptor concentration in the p-type GaN layer 21. Therefore, from a viewpoint that the p-type GaN layer 21 is thinned while obtaining the high reverse breakdown voltage, the ratio of the p-type impurity concentration to the n-type impurity concentration is preferably 10000 times or more, the p-type impurity being added into the p-type GaN layer 21, and the n-type impurity being added into the n-type GaN layer 13.

A positive hole concentration in the p-type GaN layer 21, namely, the p-type semiconductor layer 20 is preferably $1 \times 10^{16}$ cm$^{-3}$ or more.

The present inventors estimated the positive hole concentration when the Mg-concentration of the p-type GaN layer was $2 \times 10^{20}$ cm$^{-3}$. As a result, it was found that the positive hole concentration was about $7 \times 10^{16}$ cm$^{-3}$. Thereby, the positive hole concentration of the p-type GaN layer 21 is at least $1 \times 10^{16}$ cm$^{-3}$ or more. The positive hole concentration of the p-type GaN layer 21 is preferably $1 \times 10^{16}$ cm$^{-3}$ or more, from a viewpoint of obtaining the p-type GaN layer 21 with a low resistance.

Next, a method for manufacturing the semiconductor device 100 according to the first embodiment will be exemplarily described, with reference to FIG. 2A to FIG. 3B. FIGS. 2A, 2B, 3A, and 3B are schematic cross-sectional views showing a manufacturing process of the semiconductor device 100 according to the first embodiment.

Figure 2A:
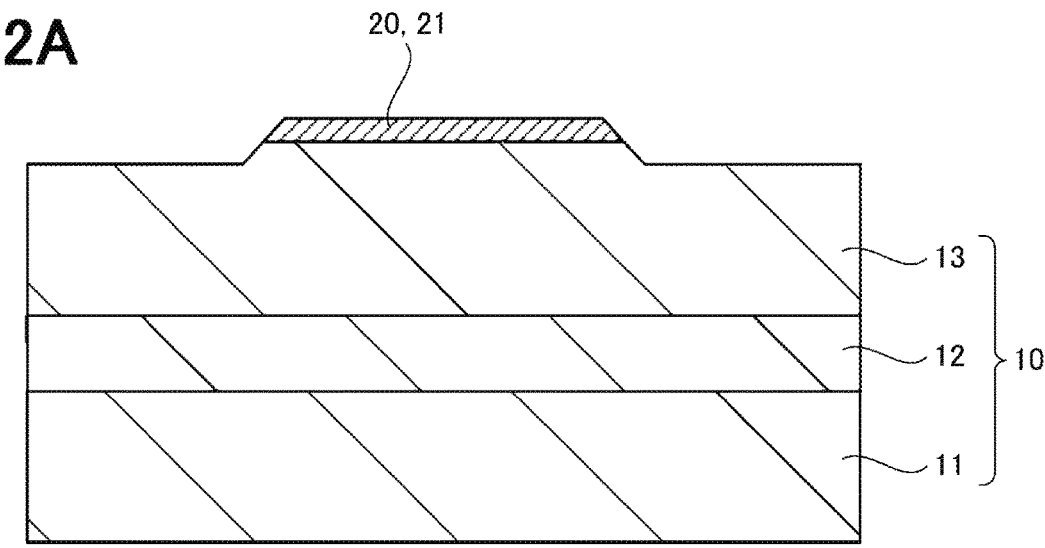
FIGS. 2A and 2B are schematic cross-sectional views showing a manufacturing process of the semiconductor device according to the first embodiment.

FIG. 2A will be referenced. The n-type GaN layer 12 is grown on the n-type GaN substrate 11, and the n-type GaN layer 13 is grown on the n-type GaN layer 12, to thereby form the n-type semiconductor layer 10. Further, the p-type GaN layer 21 is grown on the n-type semiconductor layer 10, namely, on the n-type GaN layer 13, to thereby form the p-type semiconductor layer 20. The impurity concentration added into each layer, and the thickness of each layer, etc., are described above for example.

A growth method and a raw material of each layer are not particularly limited. For example, an organic metal vapor phase epitaxy (MOVPE) can be used as the growth method. Trimethylgallium (TMG) for example can be used as a Ga-source, ammonia (NH$_3$) for example can be used as an N-source, mono-silane (SiH$_4$) for example can be used as a Si-source, and bis-cyclopentadienyl-magnesium (Cp$_2$Mg) for example can be used as an Mg-source.

After the p-type semiconductor layer 20 is formed, an annealing for activating impurities is performed at 850° C. for 30 minutes for example. In this manner, a semiconductor laminate is prepared, in which the p-type semiconductor layer 20 is laminated on the n-type semiconductor layer 10, and thereafter the mesa structure is formed by etching using a mask covering a portion on the upper surface of the p-type GaN layer 21 constituting the upper surface of the mesa structure.

Figure 2B:
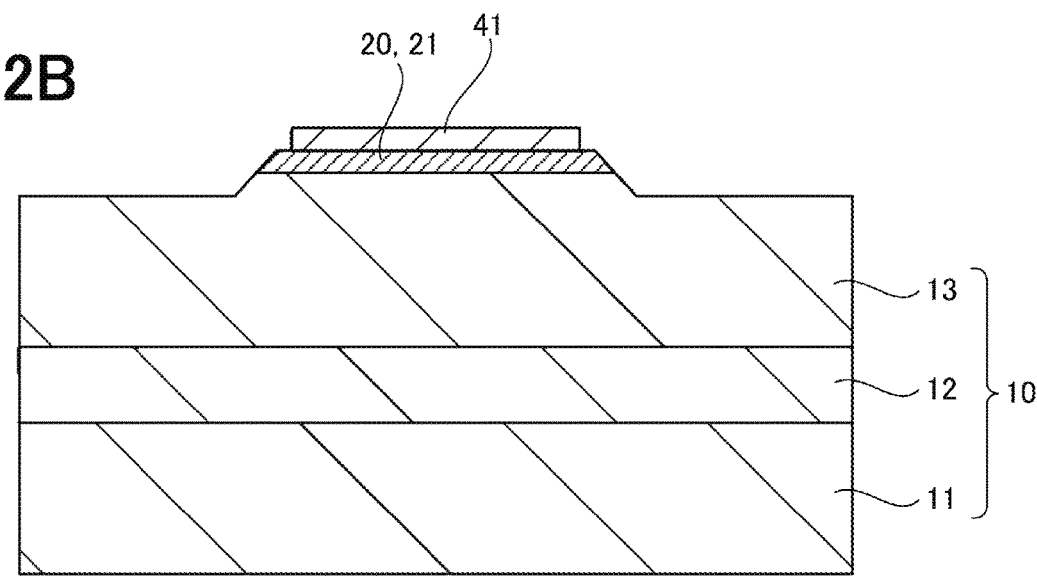

FIG. 2B will be referenced. A resist pattern having an opening in a formation area of the p-side bottom electrode 41 is formed, and then an electrode material for forming the p-side bottom electrode 41 is deposited. Then, the p-side bottom electrode 41 is formed by lift-off to remove an unnecessary portion of the electrode material together with the resist pattern. The material and the thickness of the p-side bottom electrode 11, etc., are described above for example.

Figure 3A:
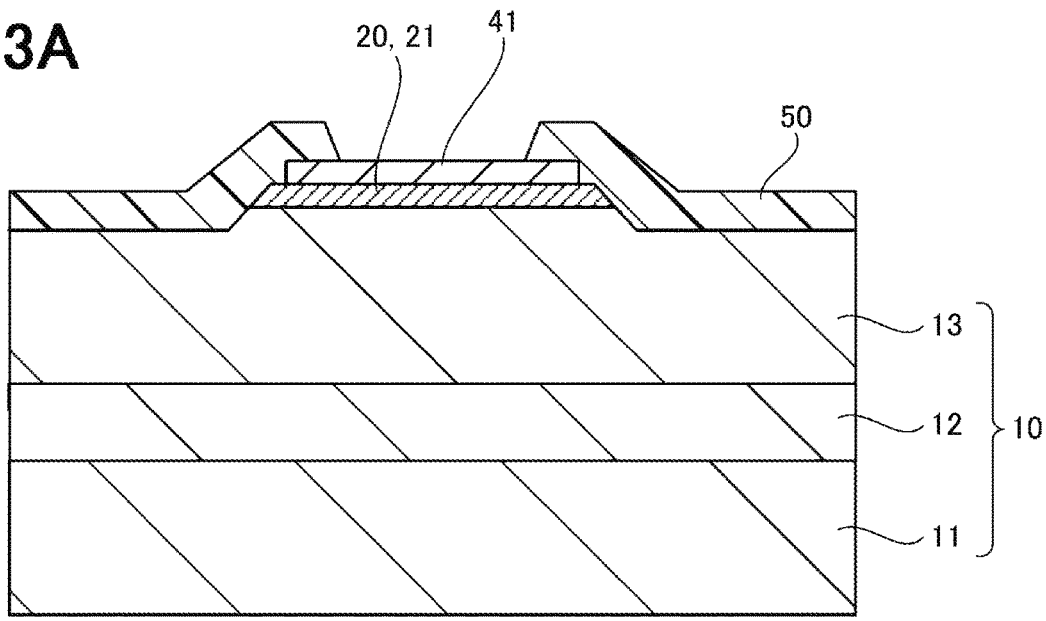
FIGS. 3A and 3B are schematic cross-sectional views showing a manufacturing process of the semiconductor device, according to the first embodiment.

FIG. 3A will be referenced. An insulating material for forming the protective film 50 is deposited on an entire surface on a mesa structure side (the p-type semiconductor layer 20 side). Then, a resist pattern is formed, having an opening on the p-side bottom electrode 41, and thereafter the protective film 50 is formed by exposing the p-side bottom electrode 41 by removing an unnecessary portion of the insulating material using etching. The material and the thickness of the protective film 50, etc., are described above for example.

Figure 3B:
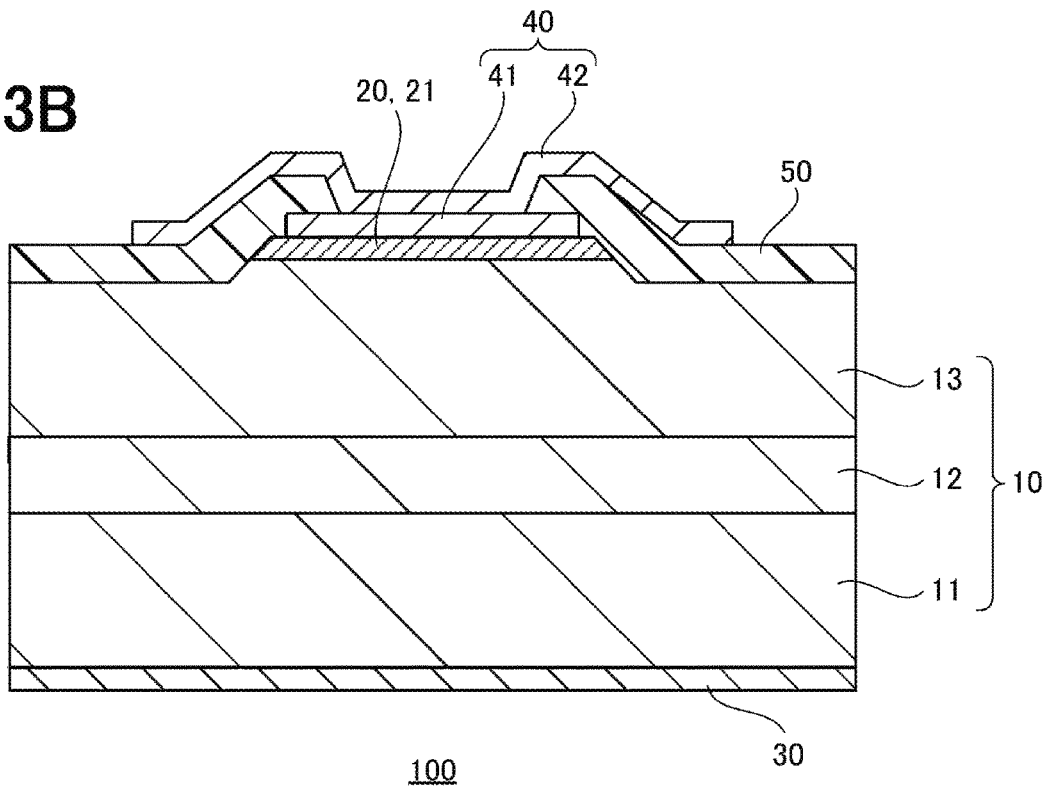

FIG. 3B will be referenced. An electrode material for forming the n-side electrode 30 is deposited on an entire surface opposite to the mesa structure (on an entire surface on the n-type semiconductor layer 10 side), to thereby form the n-side electrode 30. The material and the thickness of the n-side electrode 30, etc., are described above for example.

A resist pattern is formed on the upper surface of the mesa structure side (the p-type semiconductor layer 20 side), the resist pattern having an opening in a formation area of the p-side top electrode 42 is formed, and then an electrode material for forming the p-side top electrode 42 is deposited. Then, the p-side top electrode 42 is formed by lift-off to remove an unnecessary portion of the electrode material together with the resist pattern. The material and the thickness of the p-side top electrode 42, etc., are described above for example. In this manner, the semiconductor device 100 according to the first embodiment is manufactured.

Next, experimental results in which pn-junction diodes are actually manufactured and current-voltage characteristics in a forward and a backward directions are measured, will be exemplarily described.

An n-type GaN layer with a Si-concentration of $2 \times 10^{18}$ cm$^{-3}$ and a thickness of 2 μm was grown on an n-type GaN substrate with a Si-concentration of $2 \times 10^{18}$ cm$^{-3}$ and a thickness of 400 m, and an n-type GaN layer with a Si-concentration of $1.2 \times 10^{10}$ cm$^{-3}$ and a thickness of 5 μm was grown on the n-type GaN layer, to thereby form an n-type semiconductor layer. A p-type GaN layer with an Mg-concentration of $2 \times 10^{20}$ cm$^{-3}$ and a thickness of 20 nm was grown on the n-type semiconductor layer, to thereby form a p-type semiconductor layer. Then, a mesa structure was formed, and an n-side electrode and a p-side electrode were formed. Electrodes not having a field plate electrode portion and having a diameter of 60 μm, 100 μm, and 200 μm respectively were formed as the p-side electrode. In this way, samples of a pn-junction diode were manufactured.

Figure 4A:
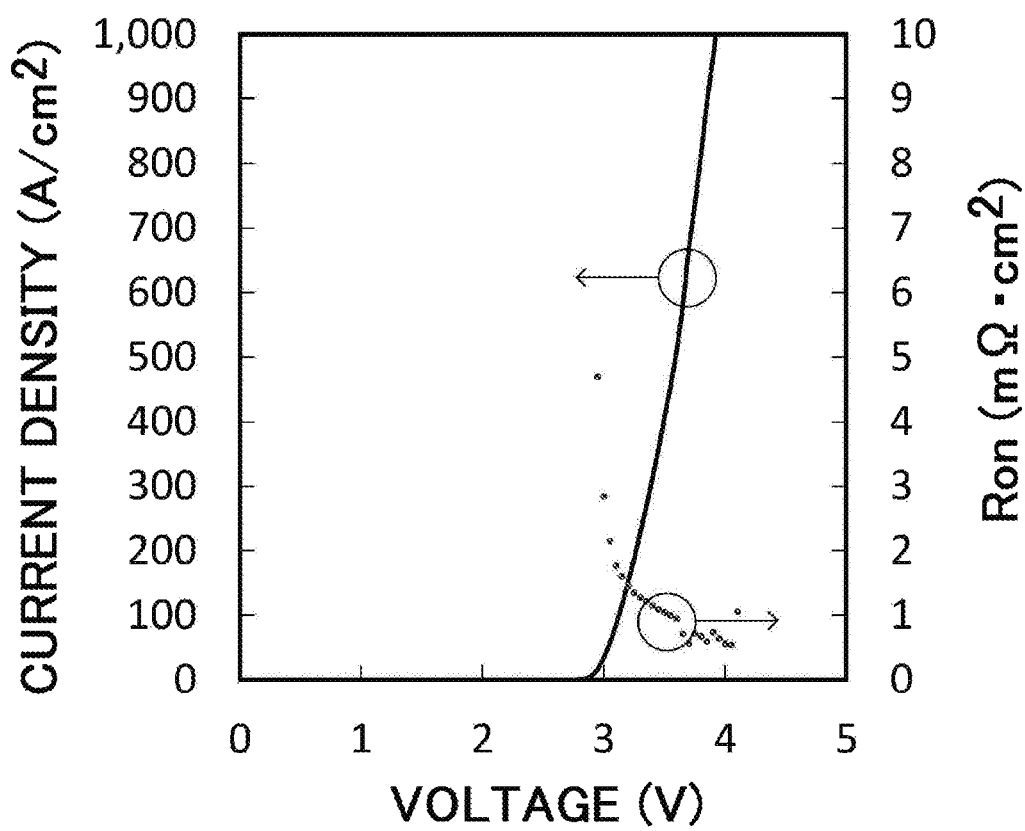
FIG. 4A is a graph for manufactured samples of the pn-junction diode, showing a current-voltage characteristic in a forward direction.

FIG. 4A is a graph for the sample with the p-side electrode diameter of 100 μm, showing a current-voltage characteristic in a forward direction. It is found that the current-voltage characteristic in the forward direction showing a rise at a voltage of about 3 V is obtained. It is noted that an on-resistance is also shown in FIG. 4A.

Figure 4B:
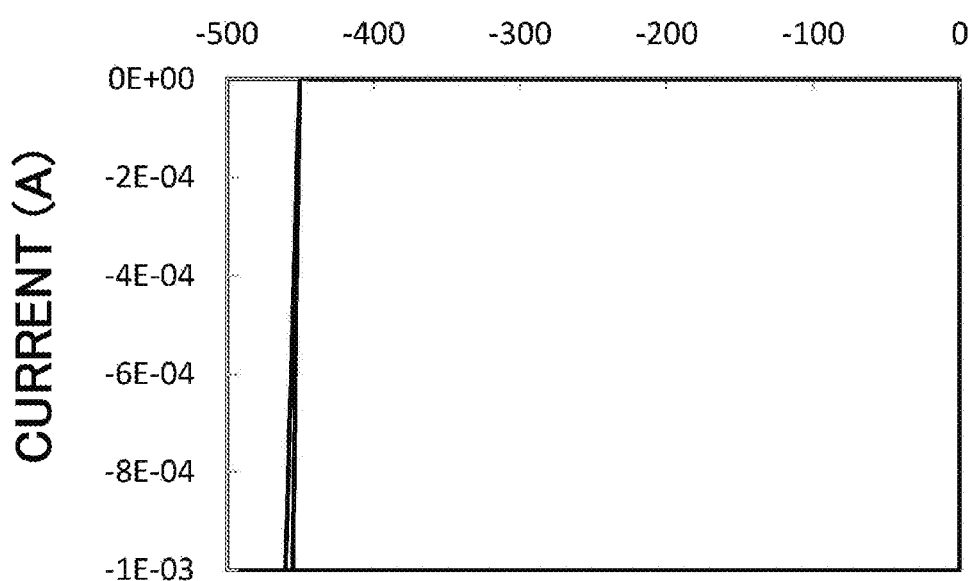
FIG. 4B is a graph for manufactured samples of the pn-junction diode, showing a current-voltage characteristic in a backward direction.

FIG. 4B is a graph for each sample with p-side electrode diameter of 60 μm, 100 μm, and 200 μm, showing current-voltage characteristic in the backward direction. It is found that the current-voltage characteristics in the backward direction with the reverse breakdown voltage of 400 V or more (about 450 V to 460 V) are obtained, even when the samples have any one of the above electrode diameters.

Further, two samples (other samples) as follows were manufacture. A sample (other sample) has a p-type semiconductor layer configured by a p-type GaN layer with an Mg-concentration of $2 \times 10^{20}$ cm$^{-3}$ and a thickness of 10 nm. And a sample (other sample) has a p-type semiconductor layer configured by a p-type GaN layer with an Mg-concentration of $2 \times 10^{20}$ cm$^{-3}$ and a thickness of 30 nm. Current-voltage characteristics in the forward and backward directions were also measured for these other samples. It was found that in these other samples, similarly to the above samples, the current-voltage characteristic in the forward direction showing a rise at a voltage of about 3 V was obtained, and the current-voltage characteristic in the backward direction with the reverse breakdown voltage of 400 V or more was obtained.

As described above, the present inventors found that pn-junction using the p-type GaN-based semiconductor layer added with the p-type impurity at the concentration of $1 \times 10^{20}$ cm$^{-3}$ or more, functioned excellently as the diode. Further, the present inventors found that pn-junction that functions excellently as the diode with the high reverse breakdown voltage of several hundred V or more can be formed, even though such a p-type GaN-based semiconductor layer had an extremely thin thickness of less than 100 nm.

Figure 5:
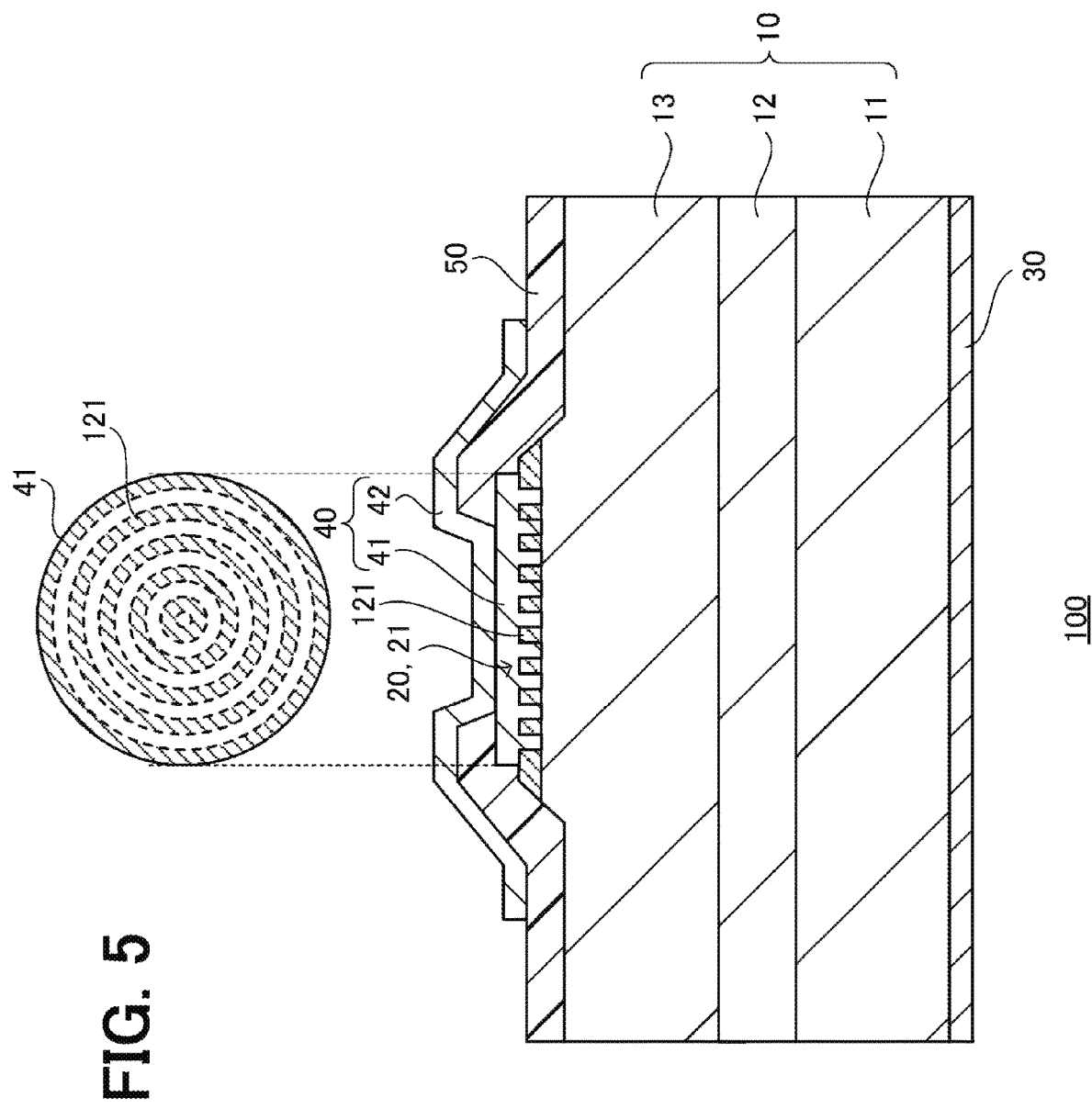
FIG. 5 is a schematic cross-sectional view of a semiconductor device according to a second embodiment, and a schematic planar view showing a shape of a p-side bottom electrode.

Next, a semiconductor device 100 according to a second embodiment will be exemplarily described, with reference to FIG. 5. FIG. 5 is a schematic cross-sectional view of the semiconductor device 100 according to the second embodiment, and also shows a schematic planar view showing a shape of a p-side bottom electrode 41 on an upper side in the drawing. A member and a structure according to the second embodiment corresponding to the first embodiment will be described, using the same numerals as the first embodiment.

In the second embodiment, as an application of the pn-junction diode described in the first embodiment, a Junction Barrier Schottky (JBS) diode having both a pn-junction diode portion and a Schottky barrier diode portion will be described.

The semiconductor device 100 according to the second embodiment differs from the semiconductor device 100 according to the first embodiment, in a point that the p-type semiconductor layer 20 is patterned so as to partially remove the entire thickness, and the p-side electrode 40 is disposed in contact with the p-type semiconductor layer 20 and the n-type semiconductor layer 10.

The p-type semiconductor layer 20, namely, the p-type GaN layer 21 is patterned so that a plurality of circular portions 121 are left concentrically for example, inside of the p-side bottom electrode 41. At a gap between the adjacent circular portions 121, the entire thickness of the p-type GaN layer 21 is removed, and the upper surface of the n-type semiconductor layer 10, namely, an upper surface of the n-type GaN layer 13 is exposed.

In this way, a structure is configured, in which the p-type GaN layer 21 and the n-type GaN layer 13 are arranged alternately in a radial direction of the circular portion 121 in a planar view. In a portion of a planar view showing a shape of the p-side bottom electrode 41, a disposition area of the p-type GaN layer 21 is indicated by hatching, and a disposition area of the n-type GaN layer 13 is indicated as an open area. A width of the circular portion 121 is about 1 μm to 10 μm for example, and a gap width between the adjacent circular portions 121 is about 1 μm to 10 μm for example.

In a planar view, the p-side bottom electrode 41, namely, the p-side electrode 40 is in contact with the p-type GaN layer 21, namely, the p-type semiconductor layer 20 on the upper surface of the p-type GaN layer 21, and is in contact with the n-type GaN layer namely, the n-type semiconductor layer 10 on the upper surface of the n-type GaN layer 13. In this way, a structure is configured, in which the p-side electrode 40 is disposed in contact with the p-type semiconductor layer 20 and the n-type semiconductor layer 10. A structure of the p-side top electrode 42 is similar to the first embodiment.

In a planar view, a region where the p-side electrode 40 is in contact with the p-type semiconductor layer 20, functions as the pn-junction diode, and a region where the p-side electrode 40 is in contact with the n-type semiconductor layer 10, functions as the Schottky barrier diode. In this way, the JBS diode is configured.

In a planar view, a proportion of an area where the p-side electrode 40 is in contact with the p-type semiconductor layer 20, based on the sum of an area where the p-side electrode 40 is in contact with the p-type semiconductor layer 20 and an area where the p-side electrode 40 is in contact with the n-type semiconductor layer 10, is preferably 20% or more and 80% or less, from a viewpoint of obtaining an excellent operation as the JBS diode.

The concentric circular shape pattern is exemplified as an aspect of the patterning of the p-type semiconductor layer 20 to configure the JBS diode. However, other pattern such as a stripe shape may be used for the above patterning, as required.

The p-side bottom electrode 41 is in contact with the p-type GaN layer 21 on the upper surface of the p-type GaN layer 21, and is in contact with the n-type GaN layer 13 on the upper surface of the n-type GaN layer 13 exposed by patterning the p-type GaN layer 21. Namely, the upper surface of the n-type semiconductor layer 10 in contact with the p-side electrode 40, is disposed at a lower position (a position closer to the substrate 11) than the upper surface of the p-type semiconductor layer 20 in contact with the p-side electrode 40 (a height of the upper surface of the p-type semiconductor layer 20 in contact with the p-side electrode 40, differs from a height of the upper surface of the n-type semiconductor layer 10 in contact with the p-side electrode 40).

As described above, since the p-type impurity concentration is $1 \times 10^{20}$ cm$^{-3}$ or more, the p-type GaN layer 21 can be formed to have a thin thickness of less than 100 nm. Since the p-type GaN layer 21 is thin, it is easy to perform the patterning of removing the entire thickness of the unnecessary portion of the p-type GaN layer 21, and easy to manufacture the JBS diode.

Since the p-type GaN layer 21 is thin, it is easy to remove the entire thickness of the unnecessary portion of the p-type GaN layer 21 by a wet etching. An anodization for example can be used as the wet etching. The anodization is preferable because the p-type GaN layer 21 can be selectively etched to the n-type GaN layer 13.

Since the wet etching such as the anodization is used for the patterning of the p-type GaN layer 21, it is possible to suppress a damage (defect) such that when using a dry etching on the upper surface of the exposed n-type GaN layer 13. As a result, on the upper surface of the n-type GaN layer 13, the following structure can be obtained: a defect density of a portion covering with the p-type GaN layer 21 is equal to a defect density of an exposed portion by removing the p-type GaN layer 21 (a portion in contact with the p-side electrode 40). Here, equal defect density means that an increase of the defect density of the exposed portion by removing the p-type GaN layer 21 (portion in contact with the p-side electrode 40), from the defect density of the portion covered with the p-type GaN layer 21, is 10% or less.

A dry etching may be used for the patterning of the p-type GaN layer 21, as required. Since the p-type GaN layer 21 is thin, it is possible to perform the processing under a mild condition for a short time and to suppress the damage to the exposed n-type GaN layer 13 even when using the dry etching.

Figure 6A:
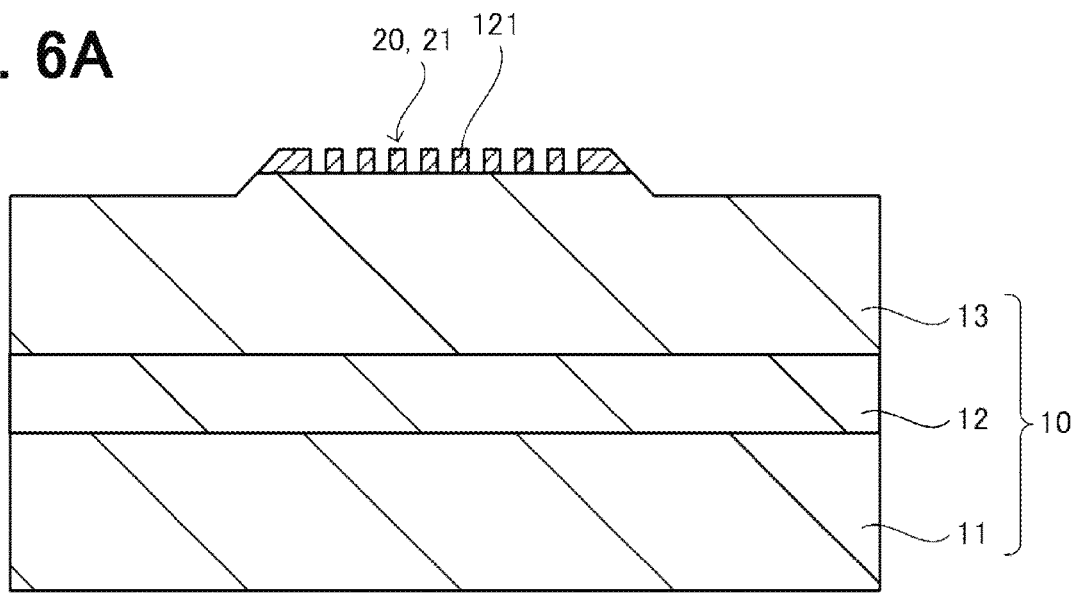
FIGS. 6A and 6B are schematic cross-sectional views showing a manufacturing process of the semiconductor device according to the second embodiment.
Figure 6B:
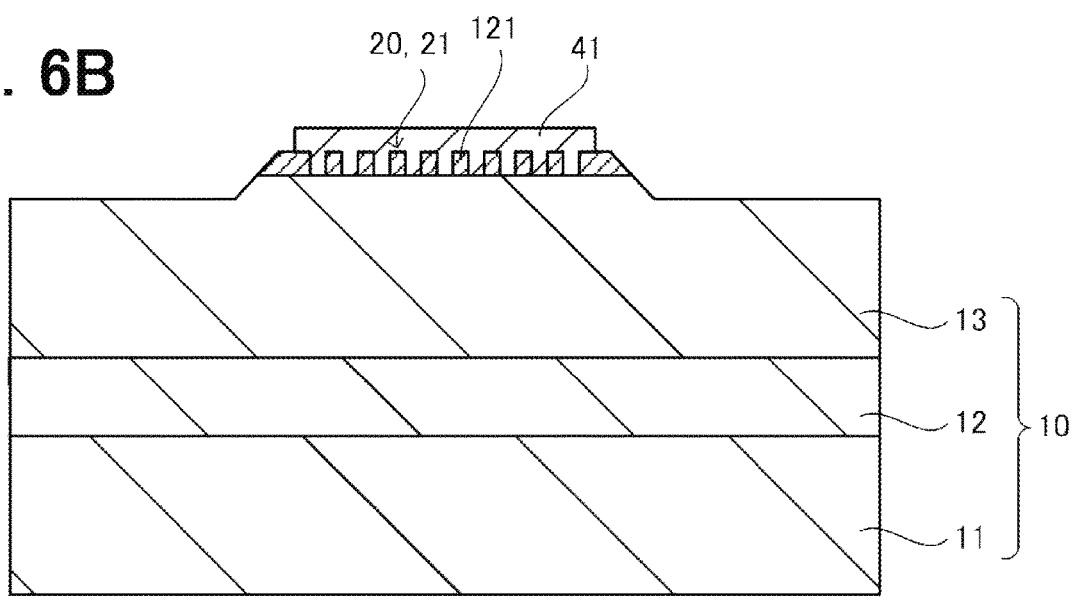

Next, a method for manufacturing the semiconductor device 100 according to the second embodiment will be exemplarily described, with reference to FIG. 6A and FIG. 6B. FIG. 6A and FIG. 6B are schematic cross-sectional views showing a manufacturing process of the semiconductor device 100 according to the second embodiment.

First, a semiconductor laminate is prepared, in which the n-type semiconductor layer 10 and the p-type semiconductor layer 20 are laminated, and the mesa structure is formed, similarly to the process described in the first embodiment with reference to FIG. 2A.

FIG. 6A will be referenced. Next, a mask is formed, which has an opening in an area where the n-type GaN layer 13 on the p-type GaN layer 21 is exposed, and a patterning for removing the p-type GaN layer 21 in an opening portion by etching is performed. A wet etching is preferably used for the patterning of the p-type GaN layer 21, and the anodization is preferably used as the wet etching.

The patterning of the p-type GaN layer 21 using the anodization is performed as follows for example. A SiO$_2$-film to be a mask is formed on the p-type GaN layer 21 by a spin-on-glass, a PECVD method, or a sputtering method. Then, a resist pattern for JBS is formed, the SiO$_2$-film is etched using a buffered hydrofluoric acid (BHF), and the mask for the anodization is formed. Next, using Teflon (registered trademark), etc., and an adhesive agent, the n-type GaN substrate 11, the n-type GaN layer 12, the n-type GaN layer 13 (n-type semiconductor layer 10), and a side of the p-type GaN layer 21 (p-type, semiconductor layer 20) is prevented from being brought into contact with an electrolytic solution. The p-type GaN layer 21 and an anode electrode are immersed in the electrolytic solution. A Pt-net is used as the anode electrode, and a silver-silver chloride electrode is used as a reference electrode. The anodization is performed by applying a voltage between the p-type semiconductor layer 20 (the p-type GaN layer 21) and the n-type semiconductor layer 10 (the n-type GaN substrate 11, the n-type GaN layer 12, and the n-type GaN layer 13), through the electrolytic solution and the anode electrode. An electrode may be formed on a back surface of the n-type GaN substrate 11 after forming the SiO$_2$-mask, and may be used as a cathode electrode.

FIG. 6B will be referenced. Similarly to the process described in the first embodiment with reference to FIG. 2B, a resist pattern having an opening in a formation area of the p-side bottom electrode 41 is formed, and an electrode material for forming the p-side bottom electrode is deposited. Then, the p-side bottom electrode 41 is formed by lift-off to remove an unnecessary portion of the electrode material together with the resist pattern.

In the second embodiment, since the p-type GaN layer 21 is patterned, the electrode material is deposited not only on the upper surface of the p-type GaN layer 21 but also on the upper surface of the n-type GaN layer 13 exposed at the gap of the p-type GaN layer 21. In this way, the p-side bottom electrode 41 is formed so as to have a shape extending from a surface of the p-type GaN layer 21 to a surface of the exposed n-type GaN layer 13, and therefore the p-side bottom electrode 41 in contact with both the p-type GaN layer 21 and the n-type GaN layer 13 is formed.

Thereafter, the protective film 50, the n-side electrode 30, and the p-side top electrode 42 are formed, similarly to the process described in the first embodiment with reference to FIG. 3A and FIG. 3B. As described above, the semiconductor device 100 according to the second embodiment is manufactured.

When the semiconductor device 100 according to the first embodiment or the second embodiment is manufactured, a semiconductor laminate 110 may be prepared, in which the n-type semiconductor layer 10 and the p-type semiconductor layer 20 are laminated in advance. Namely, the semiconductor laminate 110 may be prepared, in which the n-type semiconductor layer 10 and the p-type semiconductor layer 20 are laminated. Here, this n-type semiconductor layer 10 contains the GaN-based semiconductor. Further, this p-type semiconductor layer 20 is laminated directly on the n-type semiconductor layer 10, and contains the GaN-based semiconductor added with the p-type impurity at: a concentration of $1\times10^{20}$ cm$^{-3}$ or more. The semiconductor laminate 110 is a semiconductor laminate capable of functioning as the pn-junction diode by applying the voltage to pn-junction formed by the p-type semiconductor layer 20 and the n-type semiconductor layer 10.

FIG. 7 is a schematic cross-sectional view showing an example of the semiconductor laminate 110. The n-type semiconductor layer 10 is formed by growing the n-type GaN layer 12 and the n-type GaN layer 13 on the n-type GaN substrate 11. The p-type semiconductor layer 20 is formed by growing the p-type GaN layer 21 on the n-type semiconductor layer 10, namely, on the n-type GaN layer 13.

The p-type GaN layer 21, namely; the p-type semiconductor layer 20 is formed on an entire surface of the n-type GaN layer 13, namely, of the n-type semiconductor layer 10. The pn-junction interface is flat, which is formed by the p-type GaN layer 21 and the n-type GaN layer 13, namely; is formed by the p-type semiconductor layer 20 and the n-type semiconductor layer 10. (At least a part of) the upper surface of the p-type GaN layer 21, namely, the upper surface of the p-type semiconductor layer 20 is prepared as a formation area (contact area) of the p-side electrode 40.

Since the semiconductor laminate 110 is used, in which the n-type semiconductor layer 10 and the p-type semiconductor layer 20 are laminated in advance, it is possible to omit a process in which a semiconductor layer such as the n-type GaN layer 12 or the p-type GaN layer 21 is epitaxially grown, and it is easy to manufacture the semiconductor device 100. The p-type GaN layer 21, namely, the p-type semiconductor layer 20 can be patterned in a prescribed shape using the wet etching by the anodization for example as described above.

The semiconductor laminate 110 itself may be distributed on a market. Namely, for example, the semiconductor laminate 110 may be distributed on the market in a state that the n-side electrode 30 connected electrically to the n-type semiconductor layer 10 or the p-side electrode 40 connected electrically to the p-type semiconductor layer 20, etc., is not formed, and for example, in a state that the upper surface of the p-type semiconductor layer 20 is an upper surface of the semiconductor laminate 110.

The semiconductor laminate 110 may be used for manufacturing a semiconductor device having a configuration other than the semiconductor device 100 according to the first embodiment or the second embodiment.

As described above, according to the above embodiment, a diode using the GaN-based semiconductor can be formed by pn-junction using the p-type semiconductor layer whose p-type impurity concentration is $1\times10^{20}$ cm or more. Therefore, the p-type GaN-based semiconductor layer whose p-type impurity concentration is less than $1\times10^{20}$ cm$^{-3}$ (for example, about $10^{18}$ cm$^{-3}$), is unnecessary. Thereby, the configuration of the p-type semiconductor layer can be simplified, and the manufacturing process of the p-type semiconductor layer can be simplified. Further, the p-type semiconductor layer can be thinned, the resistance due to the p-type semiconductor layer during the forward operation can be reduced, and the energy consumption can be reduced.

As described above, the present disclosure has been described based on embodiments. However, the present disclosure is not limited thereto. For example, it will be obvious to those skilled in the art that various modifications, improvements, combinations, etc., are possible.

Preferable aspects of the present disclosure will be supplementarily described hereafter.

(Supplementary Description 1)

There is provided a semiconductor device that functions as a injunction diode, including:

a first semiconductor layer with n-type conductivity, containing a gallium nitride-based semiconductor:

a second semiconductor layer with p-type conductivity, which is laminated directly on the first semiconductor layer, and contains a gallium nitride-based semiconductor added with a p-type impurity at a concentration of $1 \times 10^{20}$ cm$^{-3}$ or more (concentration of more than $1 \times 10^{20}$ cm$^{-3}$);

a first electrode disposed in contact with the first semiconductor layer; and a second electrode disposed in contact with the second semiconductor layer.

(Supplementary Description 2)

The semiconductor device according to the supplementary description 1, wherein the concentration of the p-type impurity added into the second semiconductor layer is preferably more than $2 \times 10^{20}$ cm$^{-3}$.

(Supplementary Description 3)

The semiconductor device according to the supplementary description 1 or 2, wherein the concentration of the p-type impurity added into the second semiconductor layer is preferably less than $1 \times 10^{21}$ cm$^3$, more preferably $6 \times 10^{20}$ cm$^{-3}$ or less, and further more preferably $3 \times 10^{20}$ cm$^{-3}$ or less.

(Supplementary Description 4)

The semiconductor device according to any one of the supplementary descriptions 1 to 3, wherein a thickness of the second semiconductor layer is preferably less than 100 nm, and more preferably 30 nm or less.

(Supplementary Description 5)

The semiconductor device according to any one of the supplementary descriptions 1 to 4, wherein a thickness of the second semiconductor layer is preferably 2 nm or more, and more preferably 10 nm or more.

(Supplementary Description 6)

The semiconductor device according to any one of the supplementary descriptions 1 to 5, wherein an n-type impurity is added into the first semiconductor layer; and a ratio of the concentration of the p-type, impurity to the concentration of the n-type impurity is 10000 times or more, the p-type impurity being added into the second semiconductor layer, and the n-type impurity added into a portion of the first semiconductor layer where pn-junction with the second semiconductor layer is formed.

(Supplementary Description 7)

The semiconductor device according to any one of the supplementary descriptions 1 to 6, wherein a positive hole concentration in the second semiconductor layer is $1 \times 10^{16}$ cm$^{-3}$ or more.

(Supplementary Description 8)

The semiconductor device according to any one of the supplementary descriptions 1 to 7 wherein a breakdown voltage is 400 V or more when a reverse voltage is applied.

(Supplementary Description 9)

The semiconductor device according to any one of the supplementary descriptions 1 to 8, wherein an upper surface of the second semiconductor layer is disposed at a higher position than an upper surface of the first semiconductor layer (a height of an upper surface of the second semiconductor layer differs from a height of an upper surface of the first layer).

(Supplementary Description 10)

The semiconductor device according to any one of the supplementary descriptions 1 to 9, wherein the second electrode is disposed in contact with the second semiconductor layer and not in contact with the first semiconductor layer.

(Supplementary Description 11)

The semiconductor device according to any one of the supplementary descriptions 1 to 9, wherein the second electrode is disposed in contact with the second semiconductor layer and the first semiconductor layer; and the semiconductor device is a Junction Barrier Schottky diode that functions as the pn-junction diode and functions as a Schottky barrier diode.

(Supplementary Description 12)

The semiconductor device according to the supplementary description 11, wherein in a planar view, a proportion of an area where the second electrode is in contact with the second semiconductor layer, based on the sum of an area where the second electrode is in contact with the second semiconductor layer and an area where the second electrode is in contact with the first semiconductor layer, is 20% or more.

(Supplementary Description 13)

The semiconductor device according to the supplementary description 11 or 12, wherein in a planar view, a proportion of an area where the second electrode is in contact with the second semiconductor layer, based on the sum of an area where the second electrode is in contact with the second semiconductor layer and an area where the second electrode is in contact with the first semiconductor layer, is 80% or less.

(Supplementary Description 14)

The semiconductor device according to any one of the supplementary descriptions 11 to 13, wherein an increase of a defect density of a portion on an upper surface of the first semiconductor layer in contact with the second electrode, from a defect density of a portion on the upper surface of the first semiconductor layer covered with the second semiconductor layer, is 10% or less.

(Supplementary Description 15)

The semiconductor device according to any one of the supplementary descriptions 11 to 14, wherein the upper surface of the first semiconductor layer in contact with the second electrode, is disposed at a lower position than the upper surface of the second semiconductor layer in contact with the second electrode (a height of the upper surface of the first semiconductor layer in contact with the second electrode, differs from a height of the upper surface of the second semiconductor layer in contact with the second electrode).

(Supplementary Description 16)

There is provided a method for manufacturing a semiconductor device that functions as a pn-junction diode, including:

preparing a semiconductor laminate including a first semiconductor layer with n-type conductivity, which contains a gallium nitride-based semiconductor, and a second semiconductor layer with p-type conductivity, which is laminated directly on the first semiconductor layer and contains a gallium nitride-based semiconductor added with a p-type impurity at a concentration of $1 \times 10^{20}$ cm$^{-3}$ or more (a concentration of more than $1 \times 10^{20}$ cm$^{-3}$);

forming a first electrode disposed in contact with the first semiconductor layer; and forming a second electrode disposed in contact with the second semiconductor layer.

(Supplementary Description 17)

The method according to the supplementary description 16, further including removing partially an entire thickness of the second semiconductor layer by a wet etching, and exposing the first semiconductor layer, wherein forming the second electrode is forming the second electrode so as to have a shape extending from a surface of the second semiconductor layer to a surface of the first semiconductor layer which is exposed by the wet etching, and thereby forming the second electrode disposed in contact with the second semiconductor layer and the first semiconductor layer; and a Junction Barrier Schottky diode that functions as the pn-junction diode and functions as a Schottky Barrier diode is manufactured as the semiconductor device.

(Supplementary Description 18)

The method according to the supplementary description 17, wherein an anodization is used as the wet etching.

(Supplementary Description 19)

There is provided a semiconductor laminate capable of functioning as a pn-junction diode, including:

a first semiconductor layer with n-type conductivity, containing a gallium nitride-based semiconductor; and a second semiconductor layer with p-type conductivity, which is laminated directly on the first semiconductor layer, and contains a gallium nitride-based semiconductor added with a p-type impurity at a concentration of $1 \times 10^{20}$ cm$^{-3}$ or more (a concentration of more than $1 \times 10^{20}$ cm$^{-3}$).

(Supplementary Description 20)

The semiconductor laminate according to the supplementary description 19, wherein an upper surface of the second semiconductor layer is prepared as a contact area of an electrode.

(Supplementary Description 21)

The semiconductor laminate according to the supplementary description 19 or 20, wherein the semiconductor laminate is distributed on a market in a state that an upper surface of the second semiconductor layer is an upper surface of the semiconductor laminate.

DESCRIPTION OF SIGNS AND NUMERALS 10 n-type semiconductor layer
11, 12, 13 n-type GaN layer
20 p-type semiconductor layer
21 p-type GaN layer
30 n-side electrode
40 p-side electrode
41 p-side bottom electrode
42 p-side top electrode
50 Protective film
100 Semiconductor device
110 Semiconductor laminate
121 Circular portion

What is claimed is:

1. A semiconductor device that functions as a pn-junction diode, comprising:
    a first semiconductor layer with n-type conductivity, containing a gallium nitride-based semiconductor;
    a second semiconductor layer with p-type conductivity, which is laminated directly on the first semiconductor layer, and contains a gallium nitride-based semiconductor added with a p-type impurity at a concentration of more than $1-10^{20}$ cm$^{-3}$;
    a first electrode disposed in contact with the first semiconductor layer; and
    a second electrode disposed in contact with the second semiconductor layer,
    wherein a thickness of the second semiconductor layer is less than 100 nm, and
    the second semiconductor layer is only a single semiconductor layer with p-type conductivity in the semiconductor device.

2. The semiconductor device according to claim 1, wherein a positive hole concentration in the second semiconductor layer is $1 \times 10^{16}$ cm$^{-3}$ or more.

3. The semiconductor device according to claim 1, wherein a breakdown voltage is 400 V or more when a reverse voltage is applied.

4. The semiconductor device according to claim 1, wherein the second electrode is disposed in contact with the second semiconductor layer and not in contact with the first semiconductor layer.

5. The semiconductor device according to claim 1, wherein
    the second electrode is disposed in contact with the second semiconductor layer and the first semiconductor layer; and
    the semiconductor device is a Junction Barrier Schottky diode that functions as the pn-junction diode and functions as a Schottky barrier diode.

6. The semiconductor device according to claim 5, wherein in a planar view, a proportion of an area where the second electrode is in contact with the second semiconductor layer, based on the sum of an area where the second electrode is in contact with the second semiconductor layer and an area where the second electrode is in contact with the first semiconductor layer, is 20% or more.

7. The semiconductor device according to claim 1, wherein the second semiconductor layer comprises the p-type impurity at a concentration of $2 \times 10^{20}$ cm$^{-3}$ or more.

8. A method for manufacturing a semiconductor device that functions as a pn-junction diode, comprising:
    preparing a semiconductor laminate including a first semiconductor layer with n-type conductivity, which contains a gallium nitride-based semiconductor, and a second semiconductor layer with p-type conductivity, which is laminated directly on the first semiconductor layer and contains a gallium nitride-based semiconductor added with a p-type impurity at a concentration of more than $1-10^{20}$ cm$^{-3}$;
    forming a first electrode disposed in contact with the first semiconductor layer; and
    forming a second electrode disposed in contact with the second semiconductor layer,
    wherein a thickness of the second semiconductor layer is less than 100 nm, and
    the second semiconductor layer is only a single semiconductor layer with p-type conductivity in the semiconductor device.

9. The method for manufacturing a semiconductor device according to claim 8, further comprising removing partially an entire thickness of the semiconductor layer by a wet etching, and exposing the first semiconductor layer,
    wherein forming the second electrode is forming the second electrode so as to have a shape extending from a surface of the second semiconductor layer to a surface of the first semiconductor layer which is exposed by the wet etching, and thereby forming the second electrode disposed in contact with the second semiconductor layer and the first semiconductor layer, and
    a Junction Barrier Schottky diode that functions as the pn-junction diode and functions as a Schottky Barrier diode is manufactured as the semiconductor device.

10. The method for manufacturing a semiconductor device according to claim 9, wherein an anodization is used as the wet etching.

11. The method according to claim 8,
wherein the second semiconductor layer comprises the p-type impurity at a concentration of $2\times10^{20}$ cm$^{-3}$ or more.

12. A semiconductor laminate capable of functioning as a pn-junction diode, comprising:
a first semiconductor layer with n-type conductivity, containing a gallium nitride-based semiconductor; and
a second semiconductor layer with p-type conductivity, which is laminated directly on the first semiconductor layer, and contains a gallium nitride-based semiconductor added with a p-type impurity at a concentration of more than $1\times10^{20}$ cm$^{-3}$,
wherein a thickness of the second semiconductor layer is less than 100 nm, and
the second semiconductor layer is only a single semiconductor layer with p-type conductivity in the semiconductor laminate.

13. The semiconductor laminate according to claim 12, wherein an upper surface of the second semiconductor layer is prepared as a contact area of an electrode.

14. The semiconductor laminate according to claim 12, wherein an upper surface of the second semiconductor layer is an upper surface of the semiconductor laminate.

15. The semiconductor laminate according to claim 12,
wherein the second semiconductor layer comprises the p-type impurity at a concentration of $2\times10^{20}$ cm$^{-3}$ or more.

\* \* \* \* \*

UNITED STATES PATENT AND TRADEMARK OFFICE
CERTIFICATE OF CORRECTION

PATENT NO. : 10,797,181 B2
APPLICATION NO. : 16/327969
DATED : October 6, 2020
INVENTOR(S) : Mishima et al.

It is certified that error appears in the above-identified patent and that said Letters Patent is hereby corrected as shown below:

In the Specification

Column 4, Line 24, "50 μm and an aluminum" should read -- 50 nm and an aluminum --

Column 5, Line 11, "40 is not particularly." should read -- 40 is not limited particularly. --

Column 7, Line 7, "30 nm ran was observed" should read -- 30 nm was observed. --

Column 9, Line 52, "electrode 11, etc., are" should read -- electrode 41, etc., are --

Column 10, Line 21, "400 m, and an n-type" should read -- 400 μm, and an n-type --

Column 13, Lines 34-35, "bottom electrode is deposited" should read -- bottom electrode 41 is deposited --

Column 14, Line 67, "as a injunction diode," should read -- as a pn-junction diode, --

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*